(12) United States Patent
Sasaki

(10) Patent No.: US 6,400,200 B2
(45) Date of Patent: Jun. 4, 2002

(54) SEMICONDUCTOR INTEGRATED CIRCUIT WHICH GENERATES WAVEFORMS WHICH ARE OUT OF PHASE WITH EACH OTHER

(75) Inventor: Nagisa Sasaki, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/837,347

(22) Filed: Apr. 19, 2001

(30) Foreign Application Priority Data

Jul. 7, 2000 (JP) ........................................ 2000-207146

(51) Int. Cl.[7] ................................................ H03K 3/00

(52) U.S. Cl. .............................. 327/244; 327/3; 327/7; 327/236; 327/243; 327/269

(58) Field of Search ................................. 327/236, 238, 327/239, 242, 243, 244, 245, 2, 3, 7, 269–271, 276, 277

(56) References Cited

U.S. PATENT DOCUMENTS

| | | | | |
|---|---|---|---|---|
| 5,448,772 A | * | 9/1995 | Drandfield | 327/355 |
| 6,052,011 A | * | 4/2000 | Dasgupta | 327/270 |
| 6,194,929 B1 | * | 2/2001 | Drost et al. | 327/156 |
| 6,259,295 B1 | * | 7/2001 | Kriz et al. | 327/296 |

OTHER PUBLICATIONS

"A 900 MHz Transceiver Chip Set For Dual–Mode Cellular Radio Mobile Terminals", Iconomos A. Koullias et al., ISSC Feb. 25, 1993, Session 9, Radio Communication Circuits, Paper TP 9.2, pp. 140–141, Reading, PA.

* cited by examiner

*Primary Examiner*—Toan Tran
*Assistant Examiner*—An T. Luu
(74) *Attorney, Agent, or Firm*—Burns, Doane, Swecker & Mathis, LLP

(57) ABSTRACT

A semiconductor integrated circuit comprises a phase control unit for shifting the phase of an input signal by two or more different fixed phases so as to generate two or more output signals out of phase. A phase detector detects phase differences among the two or more output signals from the phase control unit, and generates one or more correction signals each having a value corresponding to a deviation of one of the detected phase differences from a desired phase difference. The phase detector feeds the one or more correction signals back to the phase control unit so as to make the detected phase differences equal to desired phase differences, respectively. Preferably, the phase control unit can include first and second phase shifters each for shifting the phase of the input signal by a fixed phase, a variable capacitor for capacity adjustment connected in parallel to the first phase shifter and having a control terminal, a first amplifier connected to the first phase shifter, and a second amplifier connected to the second phase shifter. In this case, amplifiers included in the phase control unit are only the first and second amplifiers which are front-end amplifiers. Accordingly, the chip area can be reduced, and the amount of current flowing in the semiconductor integrated circuit can be reduced.

5 Claims, 8 Drawing Sheets

SEMICONDUCTOR INTEGRATED CIRCUIT WHICH GENERATES WAVEFORMS WHICH ARE OUT OF PHASE WITH EACH OTHER

BACKGROUND OF THE INVENTION

1. Field of the Invention

The present invention relates to a semiconductor integrated circuit that generates two or more waveforms out of phase by a desired phase difference.

2. Description of the Prior Art

FIG. 9 is a circuit block diagram showing a prior art semiconductor integrated circuit that generates two waveforms 90° out of phase. In the figure, reference numeral 1 denotes an amplifier such as a differential amplifier, for outputting both an input signal LOIN and the inversion of the input signal, numeral 2 denotes an RC phase shifter for shifting the phase of a differential signal from the amplifier 1 to advance the phase of the differential signal, numeral 3 denotes a CR phase shifter for shifting the phase of the differential signal to delay the phase of the differential signal, numerals 4 and 5 denote front-end amplifiers, such as differential amplifiers, for amplifying the output signals from the RC phase shifter 2 and the CR phase shifter 3, those signal being 90° out of phase, respectively, numerals 6 and 7 denote adders for obtaining the sum of signal vectors from the front-end amplifiers 4 and 5, reference numeral 8 and 9 denotes back-end amplifiers for amplifying the signals output from the adders 6 and 7 respectively, those signals being 90° out of phase, and for outputting an output signal I and the inversion of the output signal I, and another output signal Q and the inversion of the other output signal Q, those signals I and Q being 90° out of phase.

FIGS. 10(a) to 10(d) are explanatory drawings showing the phases of signals at each node of the prior art semiconductor integrated circuit.

In operation, the amplifier 1 converts an input signal LOIN into differential signals S and SB and outputs them, as shown in FIG. 10(a). The RC phase shifter 2 shifts the phases of those differential motion signals S and SB so as to advance the phases of the differential motion signals S and SB, and the CR phase shifter 3 shifts the phases of the differential signals S and SB so as to delay the phases of the differential motion signals S and SB. FIG. 10(b) shows the case where only the differential signal S is shifted to a signal R by the C phase shifter 2, and is also shifted to a signal C by the CR phase shifter 3. Here, the RC phase shifter 2 and the CR phase shifter 3 perform a phase-shift of 45 degrees and a phase-shift of −45 degrees on the respective inputs when the input signal LOIN has a frequency lies within a certain frequency range in which the time constant of the RC phase shifter 2 agrees with that of the CR phase shifter 3. The output signal R of the RC phase shifter 2 and the output signal C of the CR phase shifter 3 are thus 90° out of phase. However, since the phase-shift angles and the signal amplitudes of both are deviated from their desired ones, and therefore the orthogonalization relationship between the signals R and C cannot be maintained, the deviations have to be corrected with the circuit following the RC phase shifter 2 and the CR phase shifter 3 when the input signal LOIN has a frequency in which the time constant of the RC phase shifter 2 does not agree with that of the CR phase shifter 3.

The front-end amplifiers 4 and 5 limit the amplitudes of the signal R from the RC shifter 2 and the signal C from the CR shifter 3 by amplifying the amplitudes, respectively, so as to equate the amplitudes of those signals. The adders 6 and 7 calculates the sum of the two equal-amplitude signal vectors from the front-end amplifiers 4 and 5.

Both a signal RB+C that is the sum of the inversion RB of the signal vector R and the signal vector C obtained by the adder 6, and a signal R+C that is the sum of the signal vector R and the signal vector C obtained by the adder 7 are shown in FIG. 10(c). The angle between the signal RB+C and the signal R+C is 90 degrees.

In addition, the back-end amplifiers 8 and 9 amplifies the amplitudes of the signal RB+C from the adder 6 and the signal R+C from the adder 7, respectively, so as to limit the amplitudes of those signals, and outputs two output signals I and Q which are equal in amplitude and 90° out of phase, and the respective inversions of I and Q. As shown in FIG. 10(d), the amplitude of the signal RB+C is limited by the back-end amplifier 8 and is then phase-shifted, so that the output signal I is generated, and the amplitude of the signal B+C is limited by the back-end amplifier 9 and is then phase-shifted, so that the output signal Q is generated.

Such a prior art technology is disclosed by I. A. Koullias et al., "A 900 MHz Transceiver Chip Set for Dual-Mode Cellular Radio Mobile Terminals", ISSCC Dig. of Tech. Papers, pp.140–141, February 1993, for example.

A problem with prior art semiconductor integrated circuits constructed as above is that if the two signals input to each of the adders 6 and 7 are not equal in amplitude, each of the adders 6 and 7 cannot normally calculate the sum of the two vectors applied thereto. Furthermore, although the two output signals I and Q only have to mutually have the phase difference of 90 degrees, the amplitude error of those signals should be minimized because those signals are evaluated as vectors.

Therefore, to minimize the amplitude error of those signals, it is necessary to construct the front-end amplifiers 4 and 5 and the back-end amplifiers 8 and 9 using transistors having, a larger size and a larger amount of current, and this results in an increase in the chip area and the difficulty in reduction of the amount of current flowing the semiconductor integrated circuit.

SUMMARY OF THE INVENTION

The present invention is proposed to solve the above problems. It is therefore an object to provide a semiconductor integrated circuit for generating two or more waveforms out of phase by a desired phase difference, capable of decreasing its chip area and reducing the amount of current flowing therein.

In accordance with an aspect of the present invention, there is provided a semiconductor integrated circuit comprising: a phase control unit for shifting the phase of an input signal by two or more different fixed phases so as to generate two or more output signals out of phase; and a phase detector for detecting phase differences among the two or more output signals from the phase control unit, for generating one or more correction signals each having a value corresponding to a deviation of one of the detected phase differences from a desired phase difference, and for feeding the one or more correction signals back to the phase control unit so as to make the detected phase differences equal to desired phase differences, respectively.

In accordance with another aspect of the present invention, the phase control unit includes: a first phase shifter for shifting the phase of the input signal by a fixed phase; a second phase shifter for shifting the phase of the input signal by a fixed phase; a variable capacitor for capacity adjustment connected in parallel to the first phase shifter and having a control terminal; a first amplifier connected to the first phase shifter; and a second amplifier connected to the second phase shifter. And, the phase detector includes: a mixer circuit for multiplying an output signal of the first amplifier by an output signal of the second amplifier; a reference voltage generation circuit for generating a reference voltage corresponding to a desired phase difference; and a charge pump circuit for generating a correction signal having a value corresponding to a difference between a multiplication result from the mixer circuit and the reference voltage from the reference voltage generation circuit, and for feeding the correction signal to the control terminal of the variable capacitor.

In accordance with a further aspect of the present invention, the phase control unit includes: a first phase shifter for shifting the phase of the input signal by a fixed phase; a second phase shifter for shifting the phase of the input signal by a fixed phase; a first amplifier connected to the first phase shifter and provided with a variable capacitor for capacity adjustment connected to an output terminal thereof and having a control terminal; a second amplifier connected to the first amplifier; and a third amplifier connected to the second phase shifter. And, the phase detector includes: a mixer circuit for multiplying an output signal of the second amplifier by an output signal of the third amplifier; a reference voltage generation circuit for generating a reference voltage corresponding to a desired phase difference; and a charge pump circuit for generating a correction signal having a value corresponding to a difference between a multiplication result from the mixer circuit and the reference voltage from the reference voltage generation circuit, and for feeding the correction signal to the control terminal of the variable capacitor.

In accordance with another aspect of the present invention, the phase control unit includes: a first phase shifter for shifting the phase of the input signal by a fixed phase; a second phase shifter for shifting the phase of the input signal by a fixed phase; a first variable capacitor for capacity adjustment connected in parallel to the first phase shifter and having a control terminal; a second variable capacitor for capacity adjustment connected in parallel to the second phase shifter and having a control terminal; a first amplifier connected to the first phase shifter; and a second amplifier connected to the second phase shifter. And, the phase detector includes: a mixer circuit for multiplying an output signal of the first amplifier by an output signal of the second amplifier; a reference voltage generation circuit for generating a reference voltage corresponding to a desired phase difference; and a charge pump circuit for generating first and second correction signals of opposite polarity having a value corresponding to a difference between a multiplication result from the mixer circuit and the reference voltage from the reference voltage generation circuit, and for feeding the first and second correction signal to the control terminals of the first and second variable capacitors, respectively.

In accordance with a further aspect of the present invention, the phase control unit includes: a first phase shifter for shifting the phase of the input signal by a fixed phase; a second phase shifter for shifting the phase of the input signal by a fixed phase; a first amplifier connected to the first phase shifter and provided with a variable capacitor for capacity adjustment connected to an output terminal thereof and having a control terminal; a second amplifier connected to the first amplifier; a third amplifier connected to the second phase shifter and provided with a variable capacitor for capacity adjustment connected to an output terminal thereof and having a control terminal; and a fourth amplifier connected to the third amplifier. And, the phase detector includes: a mixer circuit for multiplying an output signal of the second amplifier by an output signal of the fourth amplifier; a reference voltage generation circuit for generating a reference voltage corresponding to a desired phase difference; and a charge pump circuit for generating first and second correction signals of opposite polarity having a value corresponding to a difference between a multiplication result from the mixer circuit and the reference voltage from the reference voltage generation circuit, and for feeding the first and second correction signals to the control terminals of the variable capacitors of the first and third amplifiers, respectively.

Further objects and advantages of the present invention will be apparent from the following description of the preferred embodiments of the invention as illustrated in the accompanying drawings.

DETAILED DESCRIPTION OF THE PREFERRED EMBODIMENTS

Embodiment 1.

Figure 1:
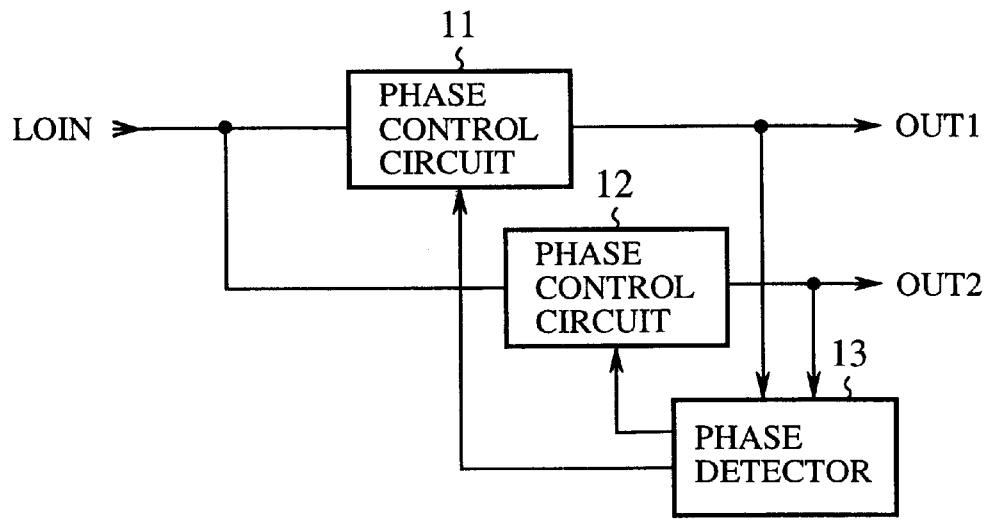
FIG. 1 is a block diagram showing a semiconductor integrated circuit for generating two or more waveforms out of phase by a desired phase difference according to a first embodiment of the present invention.

FIG. 1 is a block diagram showing a semiconductor integrated circuit for generating two or more waveforms out of phase by a desired phase difference, in accordance with a first embodiment of the present invention. In the figure, reference numerals 11 and 12 denote phase control circuits each for shifting the phase of an input signal LION by a fixed phase, numeral 13 denotes a phase detector for detecting the phase difference between an output signal OUT1 of the phase control circuit 11 and an output signal OUT2 of the phase control circuit 12, and for feeding a correction signal having a value corresponding to a deviation of the detected phase difference from a desired phase difference back to the two phase control circuits 11 and 12 so as to adjust the amount of phase shift provided by each of these phase control circuits.

Figure 2:
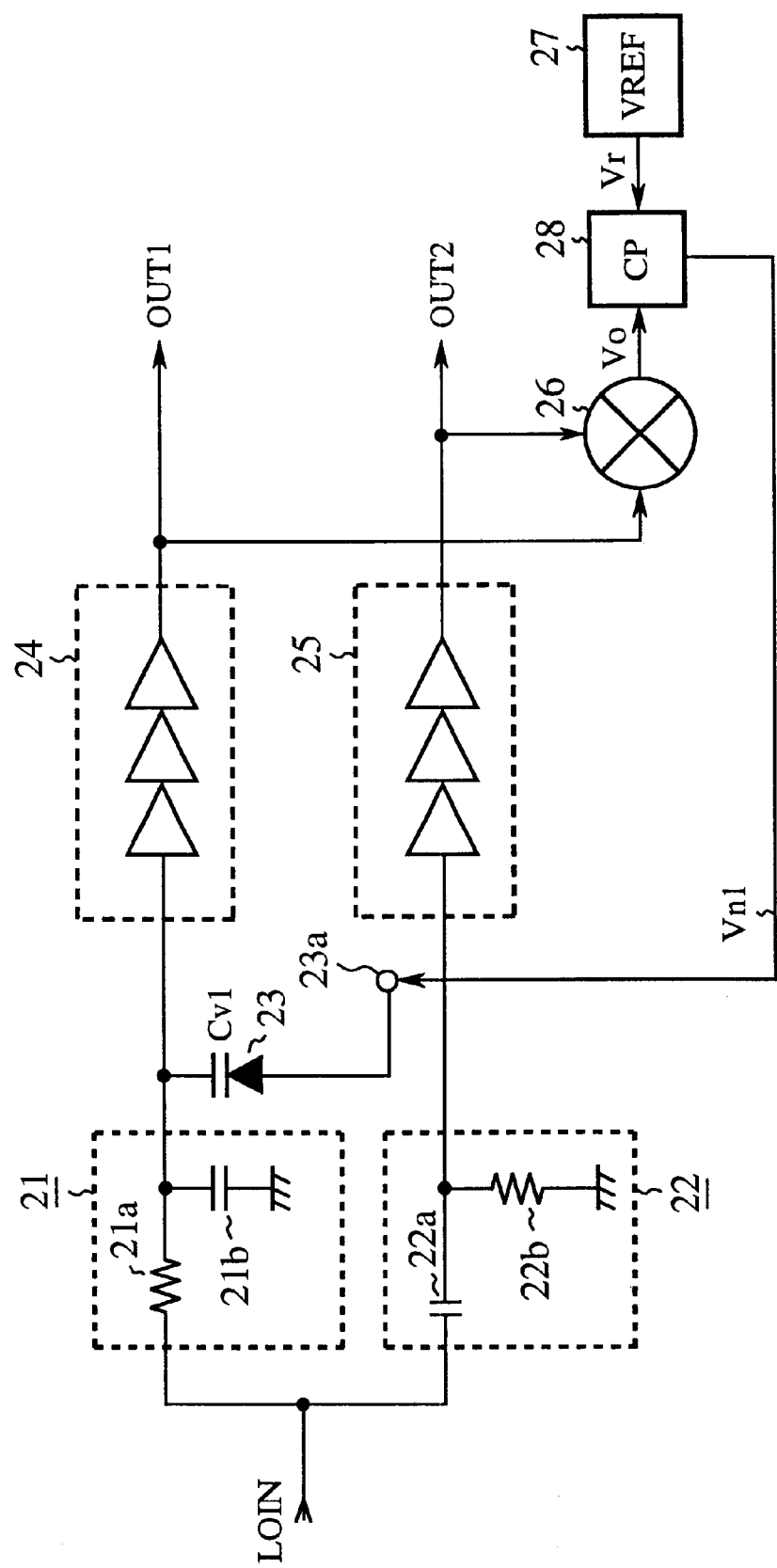
FIG. 2 is a circuit block diagram showing the semiconductor integrated circuit for generating two or more waveforms out of phase by a desired phase difference according to the first embodiment of the present invention.

FIG. 2 is a circuit block diagram showing the semiconductor integrated circuit, as shown in FIG. 1, for generating two or more waveforms out of phase by a desired phase difference according to the first embodiment of the present invention in details. In FIG. 2, reference numeral 21 denotes a RC phase shifter provided with a resistor 21a and a condenser 21b, for shifting the phase of the input signal LOIN so as to advance the phase of the input signal, and numeral 22 denotes a CR phase shifter provided with a condenser 22a and a resistor 22b, for shifting the phase of the input signal LOIN so as to delay the phase of the input signal. Further, reference numeral 23 denotes a variable capacitor, such as a varactor diode for capacity adjustment, connected in parallel to the RC phase shifter 21 and having a control terminal 23a, and numerals 24 and 25 denote amplifiers, such as differential amplifiers, for amplifying the two output signals 90° out of phase from the RC phase shifter 21 and the CR phase shifter 22, respectively.

The phase control circuit 11 of FIG. 1 includes the RC phase shifter 21, the variable capacitor 23, and the amplifier 24. The phase control circuit 12 of FIG. 1 includes the CR phase shifter 22 and the amplifier 25.

In FIG. 2, reference numeral 26 denotes a mixer circuit, such as a Gilbert cell, for multiplying the output signal OUT1 of the amplifier 24 by the output signal OUT2 of the amplifier 25, numeral 27 denotes a reference voltage generation circuit, such as a bandgap reference circuit, for generating a reference voltage corresponding to the desired phase difference, and numeral 28 denotes a charge pump circuit for generating a correction signal Vn1 having a value corresponding to the difference between the reference voltage supplied from the reference voltage generation circuit 27 and the multiplication result from the mixer circuit 26, and for feeding the correction signal Vn1 back to the control terminal 23a of the variable capacitor 23. The phase detector 13 of FIG. 1 includes the mixer circuit 26, the reference voltage generation circuit 27, and the charge pump circuit 28.

Figure 3:
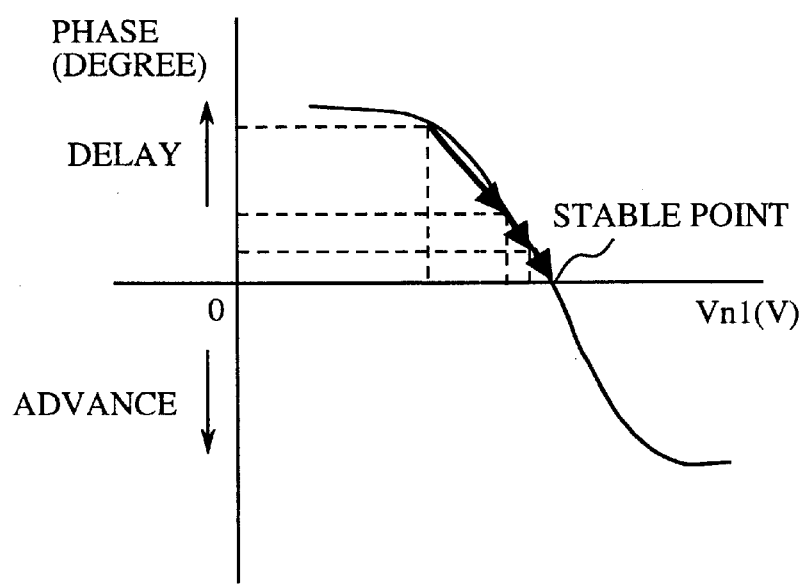
FIG. 3 is a characteristic diagram showing a relationship between a deviation of the difference between two output signals OUT1 and OUT2 from a desired phase difference and a correction signal Vn1.
Figure 4:
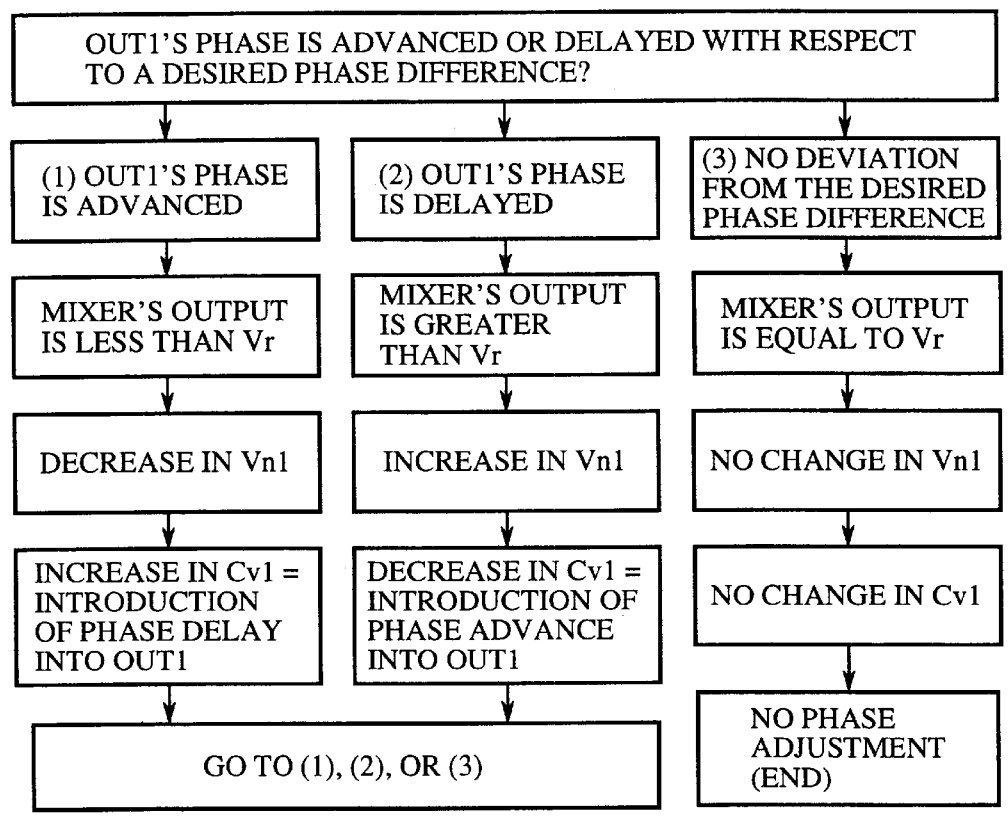
FIG. 4 is an operating state transition diagram showing the operation of the semiconductor integrated circuit according to the first embodiment of the present invention.

FIG. 3 is a diagram showing a relationship between a deviation of the detected phase difference between the two output signals OUT1 and OUT2 from the desired phase difference and the correction signal Vn1. FIG. 4 is an operating state transition diagram showing the operation of the semiconductor integrated circuit according to the first embodiment of the present invention.

In operation, the phase control circuits 11 and 12 of FIG. 1 shift the phases of the input signal LOIN and the complementary signal of the input signal LOIN, respectively, and outputs output signals OUT1 and OUT2, respectively. The phase detector 13 detects the phase difference between the output signal OUT1 of the phase control circuit 11 and the output signal OUT2 of the phase control circuit 12. The phase detector 13 feeds the correction signal having a value corresponding to a deviation of the detected phase difference from the desired phase difference back to the two phase control circuits 11 and 12, so as to adjust the amount of phase shift provided by each of these phase control circuits 11 and 12.

FIG. 2 shows the detailed structure of the FIG. 1, and the operation of the semiconductor integrated circuit for generating two or more waveforms out of phase by a desired phase difference will be described with reference to FIG. 2. The RC phase shifter 21 shifts the phase of the input signal LOIN so as to advance the phase of the input signal, and the CR phase shifter 22 shifts the phase of the input signal LOIN so as to delay the phase of the input signal. The RC phase shifter 21 and the CR phase shifter 22 can perform a phase-shift of 45 degrees and a phase-shift of −45 degrees on the respective inputs because the input signal LOIN has a frequency lies within a certain frequency range in which the time constant of the RC phase shifter 21 agrees with that of the CR phase shifter 22. The signal passing through the RC phase shifter 21 and the signal passing through the CR phase shifter 22 are thus exactly 90° out of phase. However, when the input signal LOIN has a frequency in which the time constant of the RC phase shifter 21 does not agree with that of the CR phase shifter 22, since the phase-shift angles and the signal amplitudes of both are deviated from their desired ones, and therefore the orthogonalization relationship between the two output signals from the RC phase shifter 21 and the CR phase shifter 22 cannot be maintained, the deviations have to be corrected with the circuit following the RC phase shifter 21 and the CR phase shifter 22.

The amplifiers 24 and 25 limit the amplitudes of the signal passing through the RC shifter 21 and the signal passing through the CR shifter 22 by amplifying the amplitudes of these signals, respectively, so as to generate two output signals OUT1 and OUT2 which are equal in amplitude.

Next, the mixer circuit 26 multiplies the output signal OUT1 by the output signal OUT2. The multiplication result is given by the following equation (1).

$$\cos \omega t \cdot \cos(\omega t + a + b) \tag{1}$$

where, ω is an angular frequency, a is the desired phase difference, and b is the deviation from the desired phase difference.

The equation (1) can be transformed into $$(\tfrac{1}{2})\{\cos(2\omega t + a + b) + \cos(a + b)\} \tag{2}$$

Therefore, the output of the mixer circuit 26 depends on the cosine of the sum of the double-frequency wave (2ωt), the desired phase difference a, and the deviation b.

Next, when assuming the desired phase difference a to be 90 degrees, as an example, and calculating the equation (2), the output Vo of the mixer circuit 26 is given by:

$$Vo = (\tfrac{1}{2})\{\sin(2\omega t + b) + \sin(b)\} \tag{3}$$

The reference voltage generation circuit 27 generates a reference voltage Vr, i.e., Vr=(½)sin(2ωt) obtained when it is assumed that the deviation b=0, and supplies this reference voltage to the charge pump circuit 28. The charge pump circuit 28 then generates a correction signal Vn1 having a value corresponding to the difference Vr−Vo between the reference voltage Vr supplied from the reference voltage generation circuit 27 and the multiplication result Vo from the mixer circuit 26. And, the charge pump circuit 28 feeds the correction signal Vn1 back to the control terminal 23a of the variable capacitor 23. As a result, the correction signal Vn1 fed back from the charge pump circuit 28 increases or decreases monotonously based on the reference voltage Vr supplied from the reference voltage generation circuit 27 according to the sign of Vr−Vo=sin(b).

FIG. 3 shows a case where the output signal OUT1 is delayed with respect to the desired phase difference a=90 degrees. In other words, the output signal OUT1 leads the output signal OUT2 by 90 degrees or less, and the sign of sin(b) is positive. In this case, the correction signal Vn1 fed back from the charge pump circuit 28 increases, and the capacitance value Cv1 of the variable capacitor 23 decreases. As a result, the phase of the signal passing through the RC phase shifter 21 and the variable capacitor 23 is advanced, and the phase difference between the two output signals OUT1 and OUT2 approaches the desired phase difference a=90 degrees. Unless the phase difference reaches the desired phase difference at this time, the above-mentioned operation is repeated. When the phase difference reaches the desired phase difference, the operation ends.

Referring next to the operating state transition diagram of FIG. 4, if the output signal OUT1 is advanced with respect to the desired phase difference ((1) in FIG. 4), the charge pump circuit 28 decreases the correction signal Vn1 and this results in an increase in the capacitance value Cv1 of the variable capacitor 23 because the multiplication result Vo obtained by the mixer circuit 26 is lower than the reference voltage Vr supplied from the reference voltage generation circuit 27. As a result, the output signal OUT1 is delayed.

In contrast, if the output signal OUT1 is delayed with respect to the desired phase difference ((2) in FIG. 4), the charge pump circuit 28 increases the correction signal Vn1 and this results in a decrease in the capacitance value Cv1 of the variable capacitor 23 because the multiplication result Vo obtained by the mixer circuit 26 is higher than the reference voltage Vr supplied from the reference voltage generation circuit 27. As a result, the output signal OUT1 is advanced.

And, the multiplication result Vo from the mixer circuit 26 becomes equal to the reference voltage Vr supplied from the reference voltage generation circuit 27 when there is no deviation of the detected phase difference from the desired phase difference ((3) in FIG. 4) after the above-mentioned processes are repeated. The correction signal Vn1 and the capacitance value Cv1 of the variable capacitor 23 then become constant. As a result, the adjustment of the phase shift ends.

In the first embodiment, the desired phase difference is assumed to be 90 degrees, as previously explained. The desired phase difference is not one limited to 90 degrees, and can be any degrees other than 90 degrees.

As mentioned above, in accordance with the first embodiment of the present invention, the semiconductor integrated circuit for generating two or more waveforms out of phase by a desired phase difference can be constructed of only the RC phase shifter, the CR phase shifter, the amplifiers 24 and 25 which are front-end amplifiers, the variable capacitor, and the phase detector. Therefore, the component count of the semiconductor integrated circuit can be reduced greatly by the number of back-end amplifiers compared with the prior art. As a result, the chip area can be reduced, and the amount of current flowing in the semiconductor integrated circuit can be reduced. Furthermore, the output signals can have a value corresponding to an arbitrary desired phase difference not limited to the quadrature phase difference (i.e., 90 degrees).

Embodiment 2.

Figure 5:
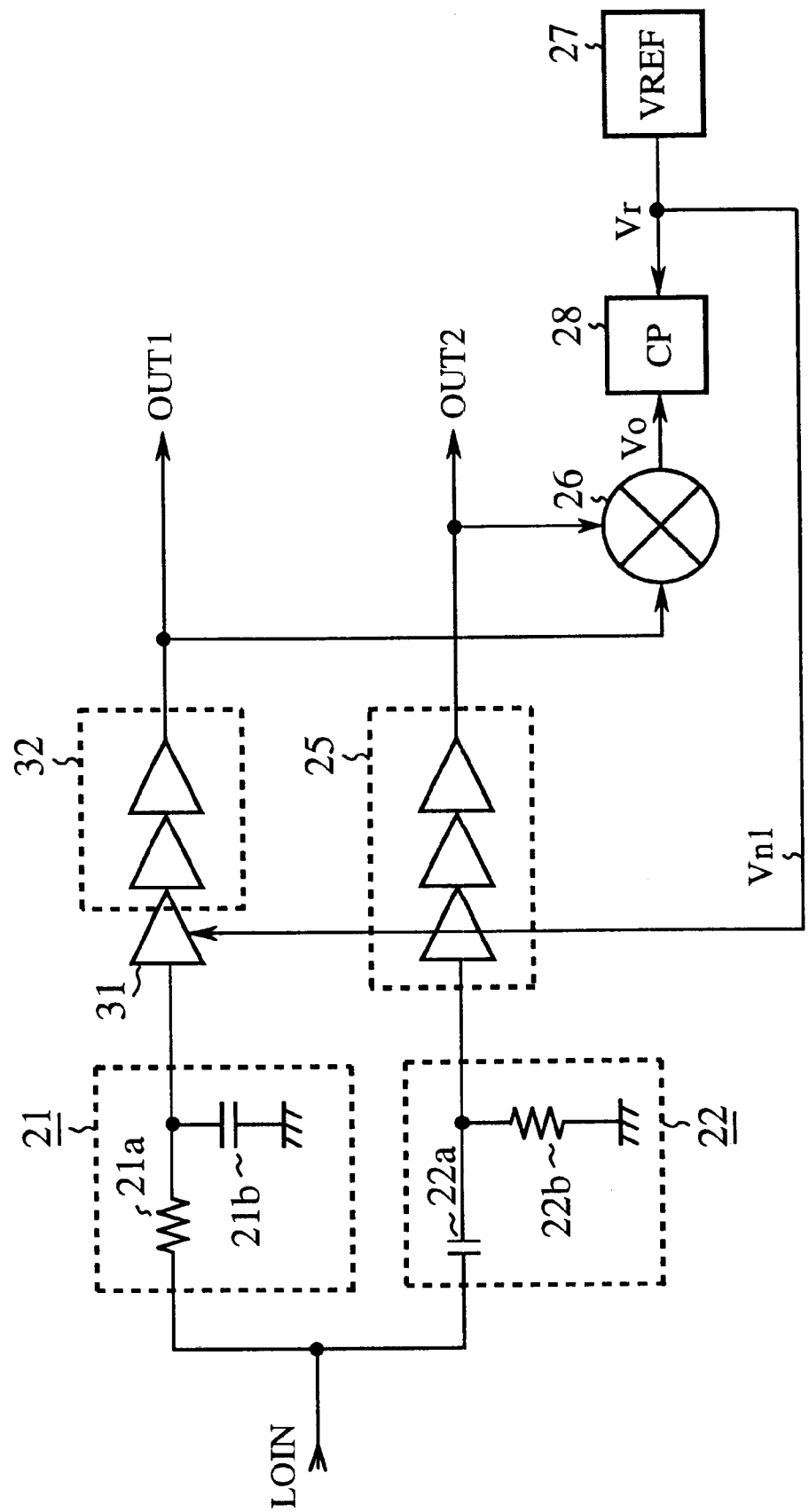
FIG. 5 is a circuit block diagram showing a semiconductor integrated circuit for generating two or more waveforms out of phase by a desired phase difference according to a second embodiment of the present invention.

FIG. 5 is a circuit block diagram showing a semiconductor integrated circuit for generating two or more waveforms out of phase by a desired phase difference according to a second embodiment of the present invention. In the figure, reference numeral 31 denotes an amplifier, such as a differential amplifier, for amplifying an output signal of a RC phase shifter 21, and numeral 32 denotes an amplifier, such as a differential amplifier, for amplifying an output signal of the amplifier 31. A phase control circuit 11 includes the RC phase shifter 21, the amplifier 31, and the amplifier 32. Since the semiconductor integrated circuit according to the second embodiment has the same structure as that of the first embodiment as shown in FIG. 2 with the exception that the semiconductor integrated circuit of the second embodiment does not include a variable capacitor and a correction signal Vn1 from a charge pump circuit 28 is delivered to the amplifier 31, and therefore the description of the same components as of the first embodiment will be omitted hereinafter.

Figure 6:
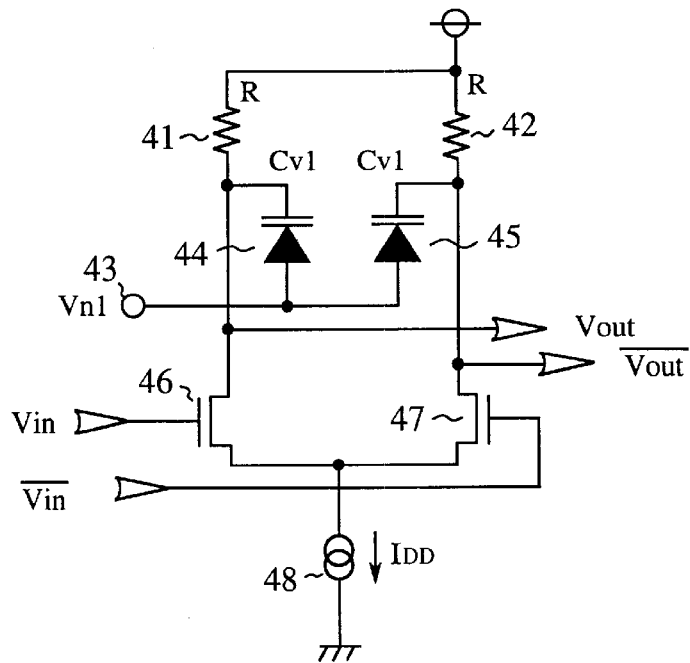
FIG. 6 is a circuit diagram showing in details an amplifier of the semiconductor integrated circuit according to the second embodiment of the present invention.

FIG. 6 is a circuit diagram showing in details the amplifier 31 shown in FIG. 5 of the semiconductor integrated circuit according to the second embodiment of the present invention. In the figure, reference numerals 41 and 42 denote resistors, numeral 43 denotes a control terminal for receiving a correction signal Vn1, numerals 44 and 45 denote variable capacitors, such as varactor diodes for capacity adjustment, connected to output terminals $V_{out}$ and $V_{out}^-$, respectively, numerals 46 and 47 denote N-channel MOS transistors having sources connected to each other, and drains connected with the resistors 41 and 42, and gates connected to input terminals $V_{in}$ and $V_{in}^-$, respectively, and numeral 48 denotes a constant-current circuit connected to the junction of the sources of the N-channel MOS transistors 46 and 47. When incorporating the amplifier 31 shown in FIG. 6 into the circuit of FIG. 5, $V_{in}$ is connected with the RC phase shifter 21, $V_{out}$ is connected with the amplifier 32, a constant DC voltage one-half that supplied to $V_{in}$ is supplied to $V_{in}^-$, and $V_{out}^-$ is opened.

In operation, the RC phase shifter 21 shifts the phase of an input signal LOIN so as to advance the phase of the input signal, and a CR phase shifter 22 shifts the phase of the input signal LOIN so as to delay the phase of the input signal. The combination of the amplifiers 31 and 32, and the amplifier 25 limit the amplitudes of the signal passing through the RC phase shifter 21 and the signal passing through the CR phase shifter 22 by amplifying the amplitudes of these signals, respectively, so as to generate output signals OUT1 and OUT2 which are equal in amplitude.

Like the first embodiment, a mixer circuit 26 multiplies the output signal OUT1 by the output signal OUT2, and a reference voltage generation circuit 27 generates a reference voltage Vr corresponding to a desired phase difference. The charge pump circuit 28 then generates a correction signal Vn1 having a value corresponding to the difference between the reference voltage Vr supplied from the reference voltage generation circuit 27 and the multiplication result Vo from the mixer circuit 26, and feeds the correction signal Vn1 back to the control terminal 43 shown in FIG. 6. As a result, the correction signal Vn1 fed back from the charge pump circuit 28 increases or decreases the capacitance value Cv1 of the variable capacitors 44 and 45, and adjusts the phase of the signal passing through the RC phase shifter 21 and the amplifier 31. The operation is repeated so that the phase difference between the two output signals OUT1 and OUT2 approaches the desired phase difference. The operation ends when the detected phase difference reaches the desired phase difference.

As mentioned above, in accordance with the second embodiment of the present invention, the semiconductor integrated circuit for generating two or more waveforms out of phase by a desired phase difference can be constructed of only the RC phase shifter, the CR phase shifter, the amplifiers 31, 32 and 25 which are front-end amplifiers, and the phase detector. Therefore, the component count of the semiconductor integrated circuit can be reduced greatly by the number of back-end amplifiers compared with the prior art. As a result, the chip area can be reduced, and the amount of current flowing in the semiconductor integrated circuit can be reduced. Furthermore, the output signals can have a value corresponding to an arbitrary desired phase difference not limited to the quadrature phase difference. In addition, since the variable capacitors 44 and 45 are built in the amplifier 31, the operation speed obtained by the structure consists of the amplifiers 31 and 32 is made fast compared with the operation speed obtained by the structure consists of the amplifier 24 and the variable capacitor 23 according to the first embodiment. Therefore, since the time of the repeating loop can be shortened, the settling speed to the desired phase difference can be made fast.

Embodiment 3.

Figure 7:
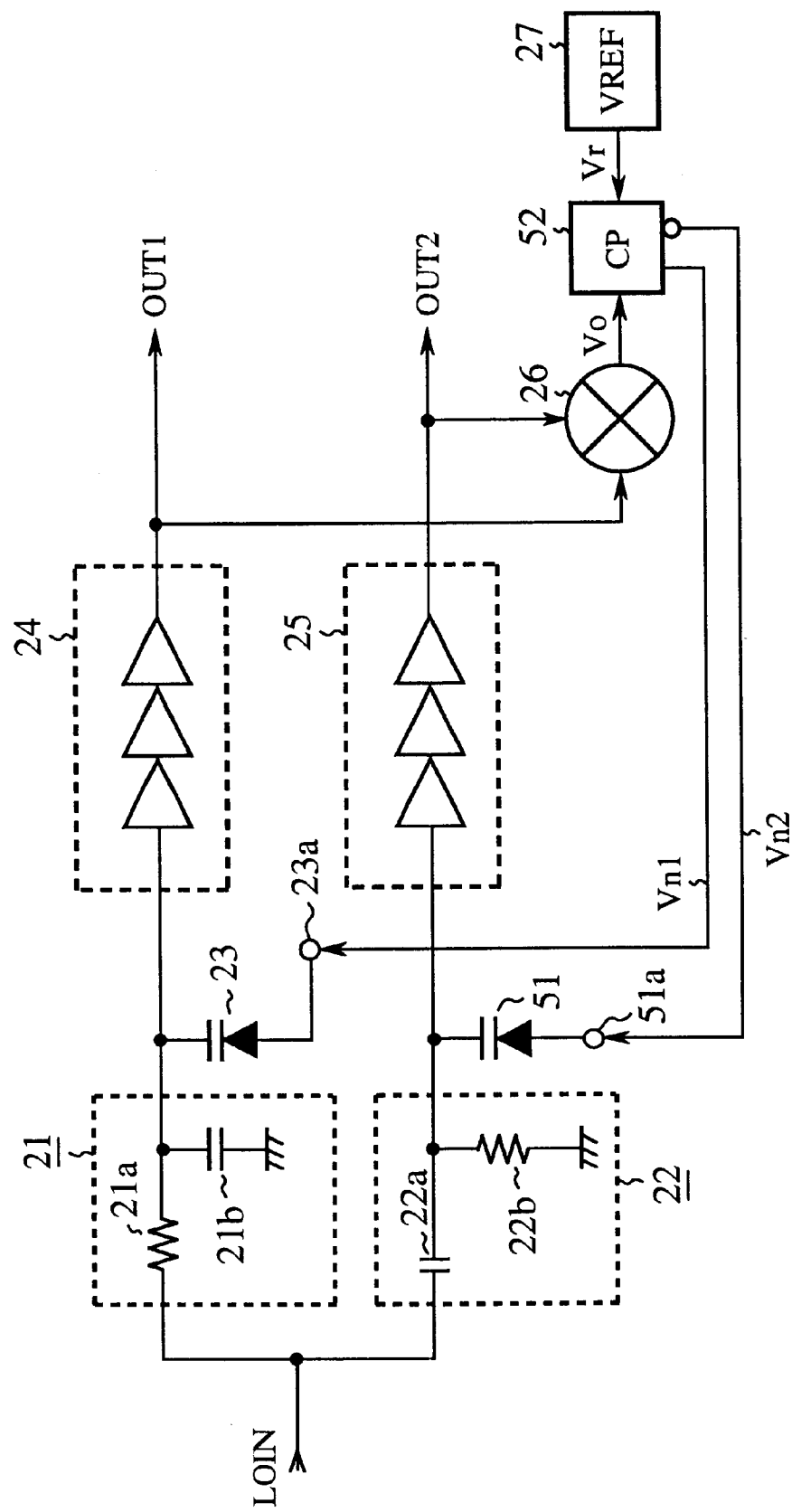
FIG. 7 is a circuit block diagram showing a semiconductor integrated circuit for generating two or more waveforms out of phase by a desired phase difference according to a third embodiment of the present invention.

FIG. 7 is a circuit block diagram showing a semiconductor integrated circuit for generating two or more waveforms out of phase by a desired phase difference according to a third embodiment of the present invention. In the figure, reference numeral 51 denotes a variable capacitor, such as a varactor diode for capacity adjustment, connected in parallel to a CR phase shifter 22 and having a control terminal 51a, and numeral 52 is a charge pump circuit for generating correction signals Vn1 and Vn2 of opposite polarity having a value corresponding to the difference between a reference voltage supplied from a reference voltage generation circuit 27 and a multiplication result from a mixer circuit 26, and for feeding the correction signals Vn1 and Vn2 back to the control terminal 23a of a variable capacitor 23 and the control terminal 51a of the variable capacitor 51, respectively. A phase control circuit 12 includes a CR phase shifter 22, the variable capacitor 51, and an amplifier 25, and a phase detector 13 includes the mixer circuit 26, the reference voltage generation circuit 27, and the charge pump circuit 52. Since the semiconductor integrated circuit according to the third embodiment has the same structure as that of the first embodiment as shown in FIG. 2 with the exception that the semiconductor integrated circuit of the third embodiment includes the variable capacitor 51 and the charge pump circuit 52.

In operation, a RC phase shifter 21 of FIG. 7 shifts the phase of an input signal LOIN so as to advance the phase of the input signal, and the CR phase shifter 22 shifts the phase of the input signal LOIN so as to delay the phase of the input signal. The amplifiers 24 and 25 limit the amplitudes of the signal passing through the RC phase shifter 21 and the signal passing through the CR phase shifter 22 by amplifying the amplitudes of these signals, respectively, so as to generate two output signals OUT1 and OUT2 which are equal in amplitude. The mixer circuit 26 multiplies the output signal OUT1 by the output signal OUT2, and the reference voltage generation circuit 27 generates a reference voltage Vr corresponding to a desired phase difference. The charge pump circuit 52 then generates correction signals Vn1 and Vn2 of opposite polarity having a value corresponding to the difference between the reference voltage supplied from the reference voltage generation circuit 27 and the multiplication result from the mixer circuit 26, and feeds the correction signals Vn1 and Vn2 back to the control terminal 23a of the variable capacitor 23 and the control terminal 51a of the variable capacitor 51, respectively. As a result, the correction signals Vn1 and Vn2 (=−Vn1) fed back from the charge pump circuit 52 increase or decrease the capacitance values Cv1 and Cv2 of the two variable capacitors 23 and 51, respectively, and adjust the phase of the signal passing through the RC phase shifter 21 and the variable capacitor 23 and the phase of the signal passing through the CR phase shifter 22 and the variable capacitor 51. The operation is repeated so that the phase difference between the two output signals OUT1 and OUT2 approaches the desired phase difference. The operation ends when the detected phase difference reaches the desired phase difference.

As mentioned above, in accordance with the third embodiment of the present invention, the semiconductor integrated circuit for generating two or more waveforms out of phase by a desired phase difference can be constructed of only the RC phase shifter, the CR phase shifter, the amplifiers 24 and 25 which are front-end amplifiers, the variable capacitors 23 and 51, and the phase detector. Therefore, the component count of the semiconductor integrated circuit can be reduced greatly by the number of back-end amplifiers compared with the prior art. As a result, the chip area can be reduced, and the amount of current flowing in the semiconductor integrated circuit can be reduced. Furthermore, the output signals can have a value corresponding to an arbitrary desired phase difference not limited to the quadrature phase difference. In addition, the changeable range of phase adjustment can be extended since the phases of the signal passing through the RC phase shifter and the signal passing through the CR phase shifter can be adjusted using the variable capacitors 23 and 51, and it is possible to correct a larger deviation from the desired phase difference.

Embodiment 4.

Figure 8:
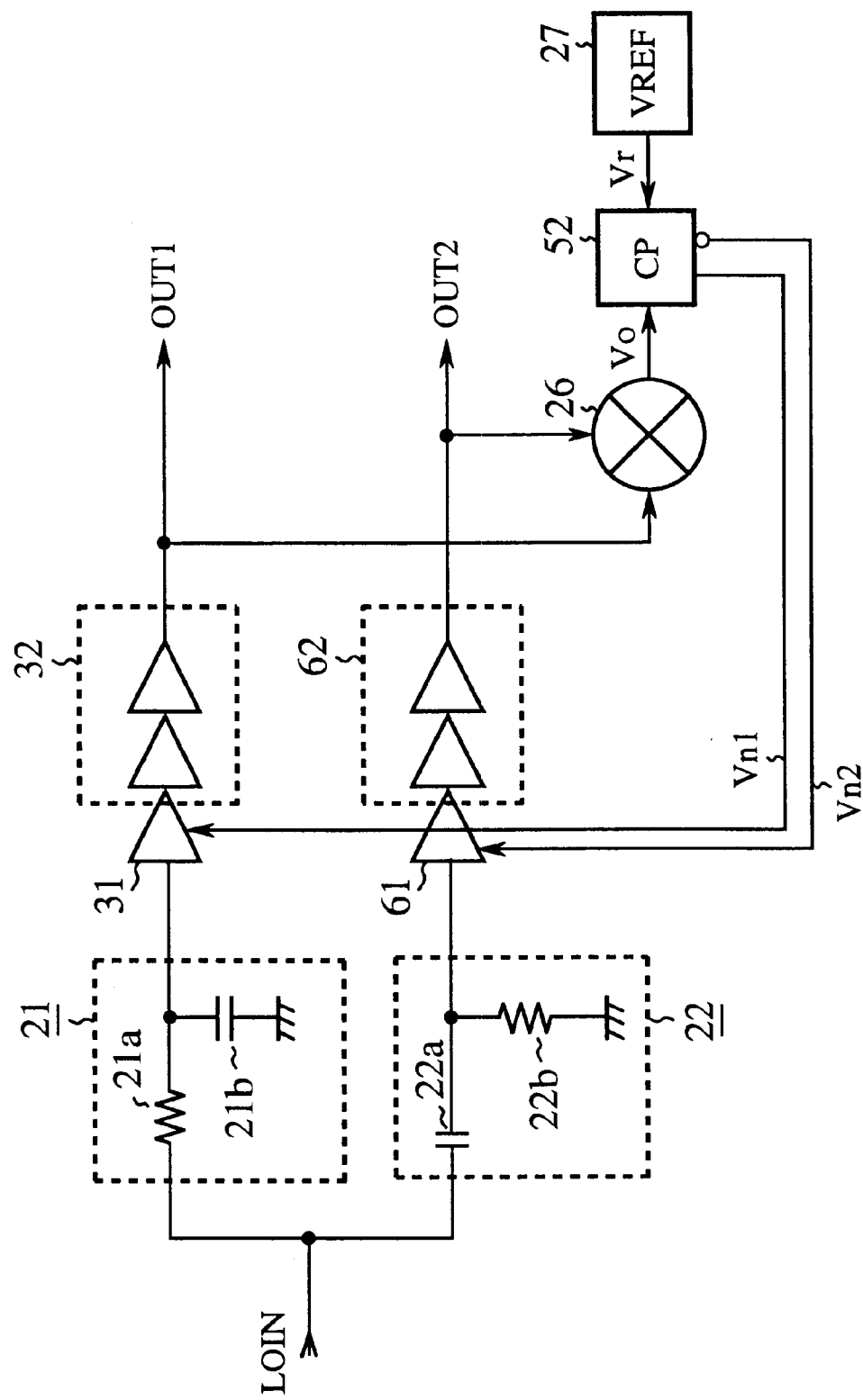
FIG. 8 is a circuit block diagram showing a semiconductor integrated circuit for generating two or more waveforms out of phase by a desired phase difference according to a fourth embodiment of the present invention.
Figure 9:
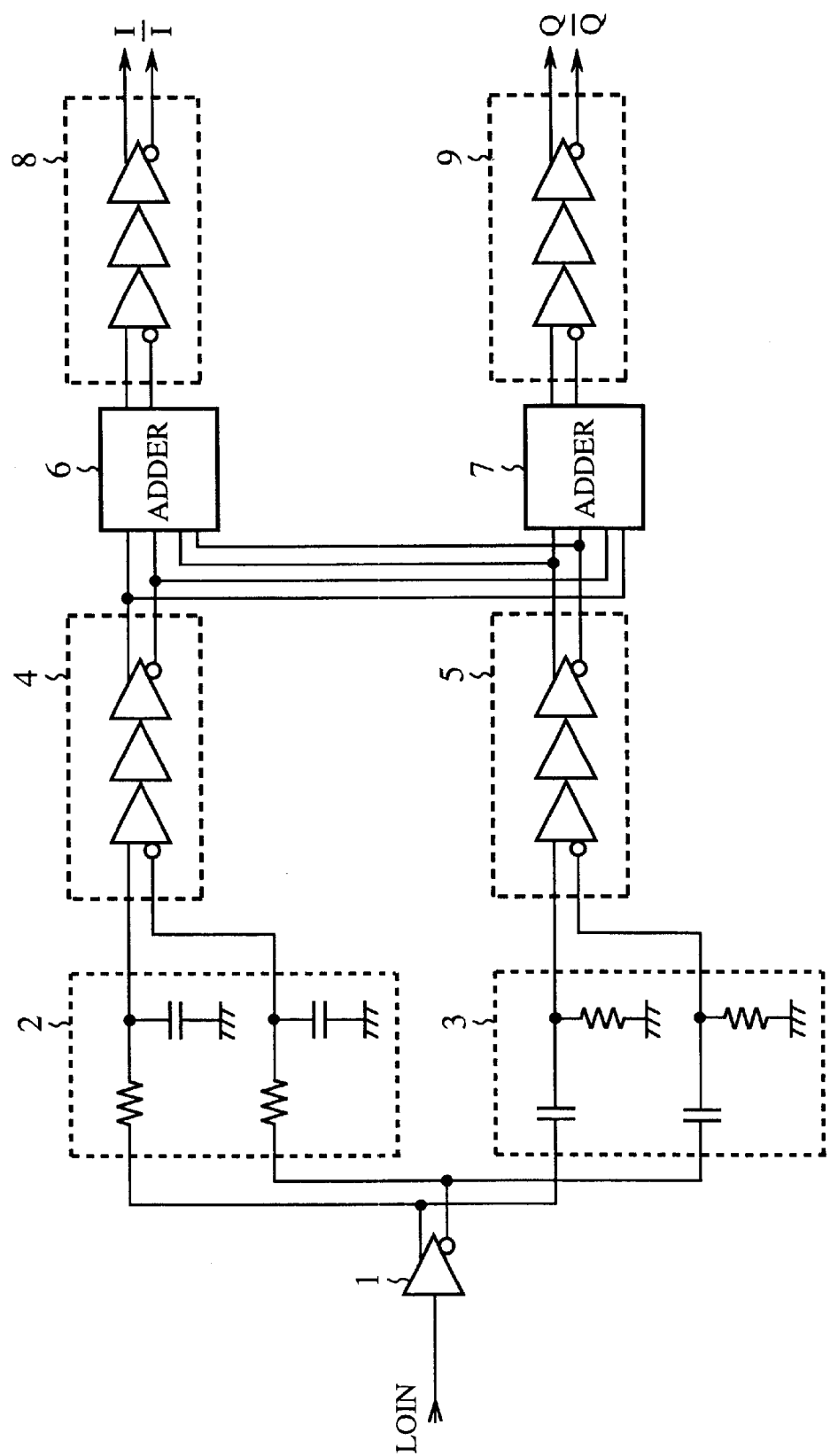
FIG. 9 is a circuit block diagram showing a prior art semiconductor integrated circuit for generating two waveforms 90° out of phase.
Figure 10A:
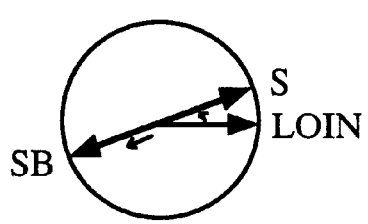
FIGS. 10(a) to 10(d) are explanatory drawings showing the phases of signals at each node in the prior art semiconductor integrated circuit of FIG. 9.
Figure 10B:
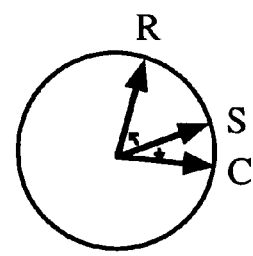
Figure 10C:
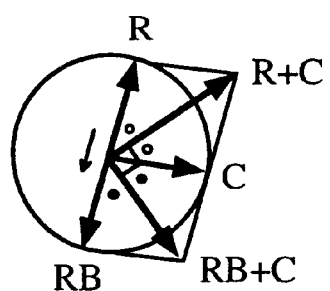
Figure 10D:
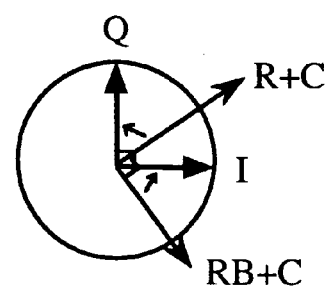

FIG. 8 is a circuit block diagram showing a semiconductor integrated circuit for generating two or more waveforms out of phase by a desired phase difference according to a fourth embodiment of the present invention. In the figure, reference numeral 61 denotes an amplifier, such as a differential amplifier, for amplifying an output signal of a CR phase shifter 22, and numeral 62 denotes an amplifier, such as a differential amplifier, for amplifying an output signal of the amplifier 61. The amplifier 61 has a structure as shown in FIG. 6. A phase control circuit 12 includes the CR phase shifter 22, the amplifier 61, and the amplifier 62. Since the semiconductor integrated circuit according to the fourth embodiment has the same structure as that of the second embodiment as shown in FIG. 5 with the exception that the semiconductor integrated circuit according to the fourth embodiment includes the amplifiers 61 and 62 and a charge pump circuit 52 of FIG. 7, and a correction signal Vn1 from the charge pump circuit 52 is delivered to the amplifier 61, and therefore the description of the same components as of the second and third embodiments will be omitted hereinafter.

In operation, a RC phase shifter 21 of FIG. 8 shifts the phase of an input signal LOIN so as to advance the phase of the input signal, and the CR phase shifter 22 shifts the phase of the input signal LOIN so as to delay the phase of the input signal. The combination of the amplifiers 31 and 32 and the combination of the amplifiers 61 and 62 limit the amplitudes of the signal passing through the RC phase shifter 21 and the signal passing through the CR phase shifter 22 by amplifying the amplitudes of these signals, respectively, so as to generate two output signals OUT1 and OUT2 which are equal in amplitude. Like the third embodiment, a mixer circuit 26 multiplies the output signal OUT1 by the output signal OUT2, and a reference voltage generation circuit 27 generates a reference voltage Vr corresponding to a desired phase difference. The charge pump circuit 52 then generates correction signals Vn1 and Vn2 of opposite polarity having a value corresponding to the difference between the reference voltage supplied from the reference voltage generation circuit 27 and the multiplication result from the mixer circuit 26, and feeds the correction signals Vn1 and Vn2 back to the control terminals 43, as shown in FIG. 6, of the amplifiers 31 and 61, respectively. As a result, the correction signals Vn1 and Vn2 fed back from the charge pump circuit 52 increase or decrease the capacitance value Cv1 of the variable capacitors 44 and 45, as shown in FIG. 6, of the amplifier 31, and the capacitance value Cv2 of the variable capacitors 44 and 45 of the amplifier 61, and adjust the phase of the signal passing through the RC phase shifter 21 and the amplifier 31 and the phase of the signal passing through the CR phase shifter 22 and the amplifier 61. The operation is repeated so that the phase difference between the two output signals OUT1 and OUT2 approaches the desired phase difference. The operation ends when the detected phase difference reaches the desired phase difference.

As mentioned above, in accordance with the fourth embodiment of the present invention, the semiconductor integrated circuit for generating two or more waveforms out of phase by a desired phase difference can be constructed of only the RC phase shifter, the CR phase shifter, the amplifiers 31, 32, 61 and 62 which are front-end amplifiers, and the phase detector. Therefore, the component count of the semiconductor integrated circuit can be reduced greatly by the number of back-end amplifiers compared with the prior art. As a result, the chip area can be reduced, and the amount of current flowing in the semiconductor integrated circuit can be reduced. Furthermore, the output signals can have a value corresponding to an arbitrary desired phase difference not limited to the quadrature phase difference. In addition, since the variable capacitors 44 and 45 are built in each of the amplifiers 31 and 61, the operation speed obtained by the structure consists of the combination of the amplifiers 31 and 32 and the combination of the amplifiers 61 and 62 is made fast compared with the operation speed obtained by the structure consists of the amplifier 24, the variable capacitor 23, the amplifier 25, and the variable capacitor 51 according to the third embodiment. Therefore, since the time of the repeating loop can be shortened, the settling speed to the desired phase difference can be made fast. In addition, the changeable range of phase adjustment can be extended since the phases of the signal passing through the RC phase shifter and the signal passing through the CR phase shifter can be adjusted using the variable capacitors 44 and 45 within each of the amplifiers 31 and 61, and it is possible to correct a larger deviation from the desired phase difference.

In either of the above-mentioned embodiments as shown in FIGS. 2 and 5 to 8, the semiconductor integrated circuit has the single phase structure. In other words, the semiconductor integrated circuit generates two equal-amplitude output signals OUT1 and OUT2 out of phase by a certain phase difference. As an alternative, the semiconductor integrated circuit can generate two equal-amplitude output signals OUT1 and OUT2 out of phase by a certain phase difference and the inversions of the two output signals OUT1 and OUT2. In this case, the same advantage can be provided.

In the second and fourth embodiments mentioned above, each of the amplifiers 31 and 61 of FIG. 6 can be constructed using P-channel MOS transistors, NPN bipolar transistors, or PNP bipolar transistors, instead of the N-channel MOS transistors. In this case, the same advantage can be provided. In addition, instead of providing the amplifier 31 or 61 containing the variable capacitors as the first stage of the combination of the amplifiers 31 and 32 or 61 and 62, the amplifier 31 or 61 can be provided as a later stage of the combination. In this case, the same advantage can be provided.

In addition, the semiconductor integrated circuit according to the present invention can be made of either a silicon substrate or a III-V family compound semiconductor substrate such as a GaAs substrate. In addition, a digital circuit, such as an exclusive-OR gate, can be used as the mixer circuit instead of the Gilbert cell.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor integrated circuit comprising:
a phase control means for shifting the phase of an input signal by two or more different fixed phases so as to generate two or more output signals out of phase; and
a phase detector for detecting phase differences among the two or more output signals from said phase control means, for generating one or more correction signals each having a value corresponding to a deviation of one of said detected phase differences from a desired phase difference, and for feeding said one or more correction signals back to said phase control means so as to make said detected phase differences equal to desired phase differences, respectively, wherein said phase detector includes a mixer circuit, a reference voltage generation circuit and a charge pump circuit.

2. The semiconductor integrated circuit according to claim 1, wherein said phase control means includes: a first phase shifter for shifting the phase of the input signal by a fixed phase; a second phase shifter for shifting the phase of the input signal by another fixed phase; a variable capacitor for capacity adjustment connected to said first phase shifter and having a control terminal; a first amplifier connected to said first phase shifter; and a second amplifier connected to said second phase shifter, and wherein said mixer circuit for multiplying an output signal of said first amplifier by an output signal of said second amplifier; said reference voltage generation circuit for generating a reference voltage corresponding to a desired phase difference; and said charge pump circuit for generating a correction signal having a value corresponding to a difference between a multiplication result from said mixer circuit and the reference voltage from said reference voltage generation circuit, and for feeding the correction signal to said control terminal of said variable capacitor.

3. The semiconductor integrated circuit according to claim 1, wherein said phase control means includes: a first phase shifter for shifting the phase of the input signal by a fixed phase; a second phase shifter for shifting the phase of the input signal by another fixed phase; a first amplifier connected to said first phase shifter and provided with a variable capacitor for capacity adjustment connected to an output terminal thereof and having a control terminal; a second amplifier connected to said first amplifier; and a third amplifier connected to said second phase shifter, and wherein said mixer circuit for multiplying an output signal of said second amplifier by an output signal of said third amplifier; said reference voltage generation circuit for generating a reference voltage corresponding to a desired phase difference; and said charge pump circuit for generating a correction signal having a value corresponding to a difference between a multiplication result from said mixer circuit and the reference voltage from said reference voltage generation circuit, and for feeding the correction signals to said control terminal of said variable capacitor.

4. The semiconductor integrated circuit according to claim 1, wherein said phase control means includes: a first phase shifter for shifting the phase of the input signal by a fixed phase; a second phase shifter for shifting the phase of the input signal by another fixed phase; a variable capacitor for capacity adjustment connected to said first phase shifter and having a control terminal; a second variable capacitor for capacity adjustment connected in parallel to said second phase shifter and having a control terminal; a first amplifier connected to said first phase shifter; and a second amplifier connected to said second phase shifter, and wherein said mixer circuit for multiplying an output signal of said first amplifier by an output signal of said second amplifier; said reference voltage generation circuit for generating a reference voltage corresponding to a desired phase difference; and said charge pump circuit for generating first and second correction signals of opposite polarity having a value corresponding to a difference between a multiplication result from said mixer circuit and the reference voltage from said reference voltage generation circuit, and for feeding the first and second correction signals to said control terminals of said first and second variable capacitors, respectively.

5. The semiconductor integrated circuit according to claim 1, wherein said phase control means includes: a first phase shifter for shifting the phase of the input signal by a fixed phase; a second phase shifter for shifting the phase of the input signal by another fixed phase; a first amplifier connected to said first phase shifter and provided with a first variable capacitor for capacity adjustment connected to an output terminal thereof and having a control terminal; a second amplifier connected to said first amplifier; a third amplifier connected to said second phase shifter and provided with a second variable capacitor for capacity adjustment connected to an output terminal thereof and having a control terminal; and a fourth amplifier connected to said third amplifier, and wherein said mixer circuit for multiplying an output signal of said second amplifier by an output signal of said fourth amplifier; said reference voltage generation circuit for generating a reference voltage corresponding to a desired phase difference; and said charge pump circuit for generating first and second correction signals of opposite polarity having a value corresponding to a difference between a multiplication result from said mixer circuit and the reference voltage from said reference voltage generation circuit, and for feeding the first and second correction signals to said control terminals of said variable capacitors of said first and third amplifiers, respectively.

* * * * *